United States Patent
Hoshino

(10) Patent No.: US 11,919,985 B2
(45) Date of Patent: Mar. 5, 2024

(54) COPOLYMER AND POSITIVE RESIST COMPOSITION

(71) Applicant: ZEON CORPORATION, Tokyo (JP)

(72) Inventor: Manabu Hoshino, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 521 days.

(21) Appl. No.: 17/273,391

(22) PCT Filed: Sep. 18, 2019

(86) PCT No.: PCT/JP2019/036643
§ 371 (c)(1),
(2) Date: Mar. 4, 2021

(87) PCT Pub. No.: WO2020/066806
PCT Pub. Date: Apr. 2, 2020

(65) Prior Publication Data
US 2021/0214481 A1      Jul. 15, 2021

(30) Foreign Application Priority Data

Sep. 25, 2018  (JP) .................. 2018-179382

(51) Int. Cl.
*C08F 220/22* (2006.01)
*G03F 7/039* (2006.01)

(52) U.S. Cl.
CPC ............ *C08F 220/22* (2013.01); *G03F 7/039* (2013.01)

(58) Field of Classification Search
CPC .............................. G03F 7/0392; C08F 220/22
See application file for complete search history.

(56) References Cited

U.S. PATENT DOCUMENTS

| 10,626,205 | B2 | 4/2020 | Ozawa et al. |
| 2003/0003392 | A1* | 1/2003 | Niwa .................... C08F 220/04 430/296 |
| 2010/0203450 | A1 | 8/2010 | Fujiwara et al. |
| 2015/0008211 | A1* | 1/2015 | Takano ............... H01L 21/0337 216/11 |
| 2020/0073240 | A1 | 3/2020 | Hoshino |

FOREIGN PATENT DOCUMENTS

| JP | 61170735 A | * 8/1986 | ............ G03F 7/039 |
| JP | S6426611 A | 1/1989 | |
| JP | 2000338671 A | 12/2000 | |
| JP | 2002156760 A | 5/2002 | |
| JP | 2002351080 A | 12/2002 | |
| JP | 2003021903 A | 1/2003 | |
| JP | 5938536 B1 | 6/2016 | |
| JP | 2017119744 A | * 7/2017 | |
| JP | 2018106062 A | 7/2018 | |
| TW | 201042370 A1 | 12/2010 | |
| TW | 201831541 A | 9/2018 | |
| WO | 0198833 A1 | 12/2001 | |
| WO | 2018123667 A1 | 7/2018 | |

OTHER PUBLICATIONS

English Machine Translation of JP2017119744A (Year: 2017).*
English Machine Translation of JP61170735A (Year: 1986).*
Nov. 26, 2019, International Search Report issued in the International Patent Application No. PCT/JP2019/036643.
Jul. 15, 2022, the Extended European Search Report issued by the European Patent Office in the corresponding European Patent Application No. 19865217.4.
Mar. 23, 2021, International Preliminary Report on Patentability issued in the International Patent Application No. PCT/JP2019/036643.

* cited by examiner

*Primary Examiner* — Mark F. Huff
*Assistant Examiner* — Nicholas E Brown
(74) *Attorney, Agent, or Firm* — KENJA IP LAW PC

(57) ABSTRACT

Provided is a copolymer that can be favorably used as a main chain scission-type positive resist that has excellent heat resistance and that can form a resist pattern having excellent resolution and clarity. The copolymer includes a monomer unit (A) represented by the following formula (I) and a monomer unit (B) represented by the following formula (II), and has a molecular weight distribution of 1.7 or less. In the formulae, L is a single bond or a divalent linking group, Ar is an optionally substituted aromatic ring group, $R^1$ is an alkyl group, $R^2$ is an alkyl group, a halogen atom, or a haloalkyl group, p is an integer of not less than 0 and not more than 5, and in a case in which more than one $R^2$ is present, each $R^2$ may be the same or different.

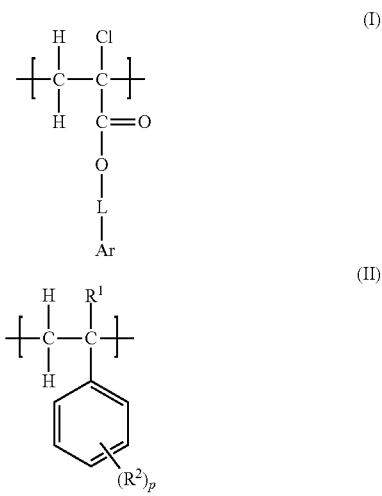

10 Claims, No Drawings

COPOLYMER AND POSITIVE RESIST COMPOSITION

TECHNICAL FIELD

The present disclosure relates to a copolymer and a positive resist composition, and, in particular, relates to a copolymer that can be suitably used as a positive resist and a positive resist composition that contains this copolymer.

BACKGROUND

Polymers that undergo main chain scission to lower molecular weight upon irradiation with ionizing radiation such as an electron beam or short-wavelength light such as ultraviolet light are conventionally used as main chain scission-type positive resists in fields such as semiconductor production. (Hereinafter, the term "ionizing radiation or the like" is used to refer collectively to ionizing radiation and short-wavelength light.)

For example, Patent Literature (PTL) 1 discloses a positive resist formed of a homopolymer of 1-phenyl-1-trifluoromethyl-2,2,2-trifluoroethyl α-chloroacrylate (poly(1-phenyl-1-trifluoromethyl-2,2,2-trifluoroethyl α-chloroacrylate)) as a positive resist having excellent dry etching resistance (for example, refer to PTL 1).

CITATION LIST

Patent Literature

PTL 1: JP-S64-26611A

SUMMARY

Technical Problem

However, the positive resist formed of poly(1-phenyl-1-trifluoromethyl-2,2,2-trifluoroethyl α-chloroacrylate) that is described in PTL 1 suffers from a problem of having low heat resistance.

Moreover, demand for further refinement of patterns in recent years has been accompanied by demand for positive resists to enable formation of resist patterns having excellent resolution and clarity.

Accordingly, an object of the present disclosure is to provide a copolymer that can be favorably used as a main chain scission-type positive resist that has excellent heat resistance and that can form a resist pattern having excellent resolution and clarity, and also to provide a positive resist composition containing this copolymer.

Solution to Problem

The inventor conducted diligent studies with the aim of achieving the object set forth above. The inventor discovered that a copolymer that is formed using specific aromatic ring-containing monomers and that has a specific molecular weight distribution (weight-average molecular weight/number-average molecular weight) has excellent heat resistance and can form a resist pattern having excellent resolution and clarity. In this manner, the inventor completed the present disclosure.

Specifically, the present disclosure aims to advantageously solve the problem set forth above, and a presently disclosed copolymer comprises: a monomer unit (A) represented by formula (I), shown below,

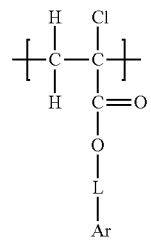

where, in formula (I), L is a single bond or a divalent linking group and Ar is an optionally substituted aromatic ring group; and a monomer unit (B) represented by formula (II), shown below,

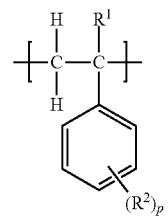

where, in formula (II), $R^1$ is an alkyl group, $R^2$ is an alkyl group, a halogen atom, or a haloalkyl group, p is an integer of not less than 0 and not more than 5, and in a case in which more than one $R^2$ is present, each $R^2$ may be the same or different, wherein the copolymer has a molecular weight distribution of 1.7 or less.

The copolymer including the monomer unit (A) and the monomer unit (B) set forth above has excellent heat resistance and can be favorably used as a main chain scission-type positive resist. Moreover, when the molecular weight distribution of the copolymer including the monomer unit (A) and the monomer unit (B) is within the range set forth above, the copolymer can form a resist pattern having excellent resolution and clarity.

Note that the "molecular weight distribution" referred to in the present disclosure can be determined by calculating a ratio of the weight-average molecular weight relative to the number-average molecular weight (weight-average molecular weight/number-average molecular weight). Moreover, the "number-average molecular weight" and the "weight-average molecular weight" referred to in the present disclosure can be measured as standard polystyrene-equivalent values by gel permeation chromatography.

In the presently disclosed copolymer, L is preferably an optionally substituted alkylene group. This is because heat resistance can be sufficiently improved when L is an optionally substituted alkylene group.

In the presently disclosed copolymer, L is preferably a divalent linking group that includes an electron withdrawing group. This is because sensitivity to ionizing radiation or the like can be improved when L is a divalent linking group that includes an electron withdrawing group.

The electron withdrawing group is preferably at least one selected from the group consisting of a fluorine atom, a fluoroalkyl group, a cyano group, and a nitro group. This is because sensitivity to ionizing radiation or the like can be sufficiently improved when the electron withdrawing group is at least one selected from the group consisting of a fluorine atom, a fluoroalkyl group, a cyano group, and a nitro group.

In the presently disclosed copolymer, it is preferable that the monomer unit (A) is a 1-phenyl-1-trifluoromethyl-2,2,2-trifluoroethyl α-chloroacrylate unit or a benzyl α-chloroacrylate unit, and the monomer unit (B) is an α-methylstyrene unit or a 4-fluoro-α-methylstyrene unit. This is because sensitivity to ionizing radiation or the like and heat resistance can be sufficiently improved when the copolymer includes the monomer units set forth above.

The presently disclosed copolymer preferably has a weight-average molecular weight of 80,000 or less. This is because sensitivity to ionizing radiation or the like can be improved when the weight-average molecular weight is not more than the upper limit set forth above.

Moreover, the present disclosure aims to advantageously solve the problem set forth above, and a presently disclosed positive resist composition comprises: any one of the copolymers set forth above; and a solvent. When the copolymer set forth above is contained as a positive resist, it is possible to form a resist film having excellent heat resistance and to form a resist pattern having excellent resolution and clarity.

Advantageous Effect

Through the presently disclosed copolymer, it is possible to provide a main chain scission-type positive resist that has excellent heat resistance and that can form a resist pattern having excellent resolution and clarity.

Moreover, through the presently disclosed positive resist composition, it is possible to form a resist film that has excellent heat resistance and a resist pattern that has excellent resolution and clarity.

DETAILED DESCRIPTION

The following provides a detailed description of embodiments of the present disclosure.

Note that the term "optionally substituted" as used in the present disclosure means "unsubstituted or having one or more substituents".

The presently disclosed copolymer can be favorably used as a main chain scission-type positive resist that undergoes main chain scission to lower molecular weight upon irradiation with ionizing radiation, such as an electron beam, or short-wavelength light, such as ultraviolet light. Moreover, the presently disclosed positive resist composition contains the presently disclosed copolymer as a positive resist and can be used, for example, in formation of a resist pattern in a production process of a semiconductor, a photomask, a mold, or the like.

(Copolymer)

The presently disclosed copolymer includes: a monomer unit (A) represented by formula (I), shown below,

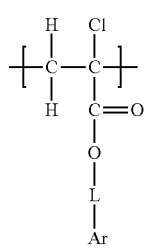

(I)

where, in formula (I), L is a single bond or a divalent linking group and Ar is an optionally substituted aromatic ring group; and a monomer unit (B) represented by formula (II), shown below,

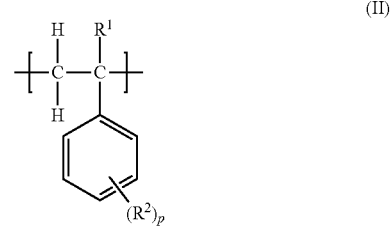

(II)

where, in formula (II), $R^1$ is an alkyl group, $R^2$ is an alkyl group, a halogen atom, or a haloalkyl group, p is an integer of not less than 0 and not more than 5, and in a case in which more than one $R^2$ is present, each $R^2$ may be the same or different. In addition, the presently disclosed copolymer has a molecular weight distribution of 1.7 or less.

Note that although the presently disclosed copolymer may also include any monomer units other than the monomer unit (A) and the monomer unit (B), the proportion constituted by the monomer unit (A) and the monomer unit (B) among all monomer units of the copolymer is, in total, preferably 90 mol % or more, and more preferably 100 mol % (i.e., the copolymer more preferably only includes the monomer unit (A) and the monomer unit (B)).

As a result of including both the specific monomer unit (A) and the specific monomer unit (B), the presently disclosed copolymer readily undergoes main chain scission upon being irradiated with ionizing radiation or the like (for example, an electron beam, a KrF laser, an ArF laser, an EUV laser, or the like) and has excellent heat resistance compared to a homopolymer that only includes one of these monomer units, for example.

Moreover, when the presently disclosed copolymer is used as a positive resist to form a resist pattern, the presently disclosed copolymer can form a resist pattern having excellent resolution and clarity as a result of having a molecular weight distribution that is not more than the upper limit set forth above.

<Monomer Unit (A)>

The monomer unit (A) is a structural unit that is derived from a monomer (a) represented by formula (III), shown below.

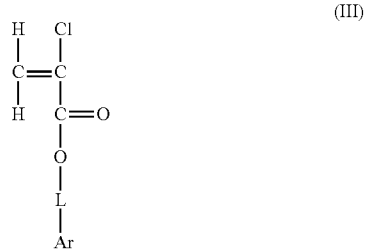

(III)

(In formula (III), L and Ar are the same as in formula (I).)

The proportion constituted by the monomer unit (A) among all monomer units of the copolymer is not specifically limited but can, for example, be set as not less than 30 mol % and not more than 70 mol %.

A divalent linking group that can constitute L in formula (I) and formula (III) is not specifically limited and may be an optionally substituted alkylene group, an optionally substituted alkenylene group, or the like, for example.

The alkylene group of the optionally substituted alkylene group is not specifically limited and may be a chain alkylene group such as a methylene group, an ethylene group, a propylene group, an n-butylene group, or an isobutylene group or a cyclic alkylene group such as a 1,4-cyclohexylene group, for example. Of these examples, the alkylene group is preferably a chain alkylene group having a carbon number of 1 to 6 such as a methylene group, an ethylene group, a propylene group, an n-butylene group, or an isobutylene group, more preferably a linear alkylene group having a carbon number of 1 to 6 such as a methylene group, an ethylene group, a propylene group, or an n-butylene group, and even more preferably a linear alkylene group having a carbon number of 1 to 3 such as a methylene group, an ethylene group, or a propylene group.

The alkenylene group of the optionally substituted alkenylene group is not specifically limited and may be a chain alkenylene group such as an ethenylene group, a 2-propenylene group, a 2-butenylene group, or a 3-butenylene group or a cyclic alkenylene group such as a cyclohexenylene group. Of these examples, the alkenylene group is preferably a linear alkenylene group having a carbon number of 2 to 6 such as an ethenylene group, a 2-propenylene group, a 2-butenylene group, or a 3-butenylene group.

Of the examples given above, the divalent linking group is preferably an optionally substituted alkylene group from a viewpoint of sufficiently improving sensitivity to ionizing radiation or the like and heat resistance, with an optionally substituted chain alkylene group having a carbon number of 1 to 6 being more preferable, an optionally substituted linear alkylene group having a carbon number of 1 to 6 even more preferable, and an optionally substituted linear alkylene group having a carbon number of 1 to 3 particularly preferable.

Moreover, the divalent linking group that can constitute L in formula (I) and formula (III) preferably includes one or more electron withdrawing groups from a viewpoint of further improving sensitivity to ionizing radiation or the like. In particular, in a case in which the divalent linking group is an alkylene group that includes an electron withdrawing group as a substituent or an alkenylene group that includes an electron withdrawing group as a substituent, the electron withdrawing group is preferably bonded to a carbon that is bonded to the oxygen adjacent to the carbonyl carbon in formula (I) and formula (III).

Note at least one selected from the group consisting of a fluorine atom, a fluoroalkyl group, a cyano group, and a nitro group may, for example, serve as an electron withdrawing group that can sufficiently improve sensitivity to ionizing radiation or the like without any specific limitations. The fluoroalkyl group is not specifically limited and may be a fluoroalkyl group having a carbon number of 1 to 5, for example. In particular, the fluoroalkyl group is preferably a perfluoroalkyl group having a carbon number of 1 to 5, and more preferably a trifluoromethyl group.

From a viewpoint of sufficiently improving sensitivity to ionizing radiation or the like and heat resistance, L in formula (I) and formula (III) is preferably a methylene group, a cyanomethylene group, a trifluoromethylmethylene group, or a bis(trifluoromethyl)methylene group, and is more preferably a bis(trifluoromethyl)methylene group.

Ar in formula (I) and formula (III) may be an optionally substituted aromatic hydrocarbon ring group or an optionally substituted aromatic heterocyclic group.

The aromatic hydrocarbon ring group is not specifically limited and may be a benzene ring group, a biphenyl ring group, a naphthalene ring group, an azulene ring group, an anthracene ring group, a phenanthrene ring group, a pyrene ring group, a chrysene ring group, a naphthacene ring group, a triphenylene ring group, an o-terphenyl ring group, an m-terphenyl ring group, a p-terphenyl ring group, an acenaphthene ring group, a coronene ring group, a fluorene ring group, a fluoranthene ring group, a pentacene ring group, a perylene ring group, a pentaphene ring group, a picene ring group, a pyranthrene ring group, or the like, for example.

The aromatic heterocyclic group is not specifically limited and may be a furan ring group, a thiophene ring group, a pyridine ring group, a pyridazine ring group, a pyrimidine ring group, a pyrazine ring group, a triazine ring group, an oxadiazole ring group, a triazole ring group, an imidazole ring group, a pyrazole ring group, a thiazole ring group, an indole ring group, a benzimidazole ring group, a benzothiazole ring group, a benzoxazole ring group, a quinoxaline ring group, a quinazoline ring group, a phthalazine ring group, a benzofuran ring group, a dibenzofuran ring group, a benzothiophene ring group, a dibenzothiophene ring group, a carbazole ring group, or the like, for example.

Examples of possible substituents of Ar include, but are not specifically limited to, an alkyl group, a fluorine atom, and a fluoroalkyl group. Examples of alkyl groups that are possible substituents of Ar include chain alkyl groups having a carbon number of 1 to 6 such as a methyl group, an ethyl group, a propyl group, an n-butyl group, and an isobutyl group. Examples of fluoroalkyl groups that are possible substituents of Ar include fluoroalkyl groups having a carbon number of 1 to 5 such as a trifluoromethyl group, a trifluoroethyl group, and a pentafluoropropyl group.

Of the examples given above, Ar in formula (I) and formula (III) is preferably an optionally substituted aromatic hydrocarbon ring group from a viewpoint of sufficiently improving sensitivity to ionizing radiation or the like and heat resistance, with an unsubstituted aromatic hydrocarbon ring group being more preferable, and a benzene ring group (phenyl group) even more preferable.

Moreover, from a viewpoint of sufficiently improving sensitivity to ionizing radiation or the like and heat resistance, the monomer (a) represented by formula (III) described above that can form the monomer unit (A) represented by formula (I) described above is preferably benzyl α-chloroacrylate or 1-phenyl-1-trifluoromethyl-2,2,2-trifluoroethyl α-chloroacrylate, and more preferably 1-phenyl-1-trifluoromethyl-2,2,2-trifluoroethyl α-chloroacrylate. In other words, the copolymer preferably includes either or both of a 1-phenyl-1-trifluoromethyl-2,2,2-trifluoroethyl α-chloroacrylate unit and a benzyl α-chloroacrylate unit, and more preferably includes a 1-phenyl-1-trifluoromethyl-2,2,2-trifluoroethyl α-chloroacrylate unit.

<Monomer Unit (B)>

The monomer unit (B) is a structural unit that is derived from a monomer (b) represented by formula (IV), shown below.

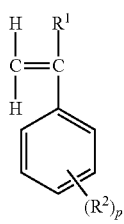
(IV)

(In formula (IV), $R^1$, $R^2$, and p are the same as in formula (II).)

The proportion constituted by the monomer unit (B) among all monomer units of the copolymer is not specifically limited but can, for example, be set as not less than 30 mol % and not more than 70 mol %.

Examples of alkyl groups that can constitute $R^1$ and $R^2$ in formula (II) and formula (IV) include, but are not specifically limited to, unsubstituted alkyl groups having a carbon number of 1 to 5. Of these examples, a methyl group or an ethyl group is preferable as an alkyl group that can constitute $R^1$ and $R^2$.

Examples of halogen atoms that can constitute $R^2$ in formula (II) and formula (IV) include, but are not specifically limited to, a fluorine atom, a chlorine atom, a bromine atom, and an iodine atom. Of these examples, a fluorine atom is preferable as the halogen atom.

Examples of haloalkyl groups that can constitute $R^2$ in formula (II) and formula (IV) include, but are not specifically limited to, fluoroalkyl groups having a carbon number of 1 to 5. Of these examples, a perfluoroalkyl group having a carbon number of 1 to 5 is preferable, and a trifluoromethyl group is more preferable as the haloalkyl group.

From a viewpoint of ease of production of the copolymer and improving main chain scission properties upon irradiation with ionizing radiation or the like, $R^1$ in formula (II) and formula (IV) is preferably an alkyl group having a carbon number of 1 to 5, and more preferably a methyl group.

Moreover, from a viewpoint of ease of production of the copolymer and improving main chain scission properties upon irradiation with ionizing radiation or the like, p in formula (II) and formula (IV) is preferably 0 or 1.

In particular, from a viewpoint of improving heat resistance of the copolymer and resolution and clarity of an obtained resist pattern, it is preferable that p is 1 and $R^2$ is a fluorine atom or a fluoroalkyl group having a carbon number of 1 to 5 in formula (II) and formula (IV), more preferable that p is 1 and $R^2$ is a fluorine atom or a perfluoroalkyl group having a carbon number of 1 to 5 in formula (II) and formula (IV), and even more preferable that p is 1 and $R^2$ is a fluorine atom in formula (II) and formula (IV).

Examples of the monomer (b) represented by formula (IV) described above that can form the monomer unit (B) represented by formula (II) described above include, but are not specifically limited to, α-methylstyrene and derivatives thereof, such as (b-1) to (b-12), shown below.

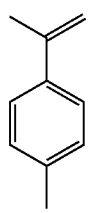
(b-1)

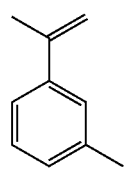
(b-2)

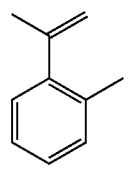
(b-3)

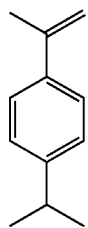
(b-4)

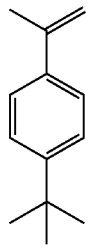
(b-5)

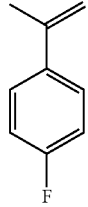
(b-6)

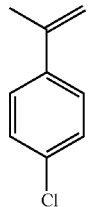
(b-7)

(b-8)

(b-9)

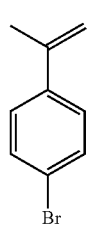

(b-10)

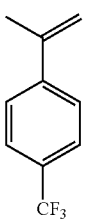

(b-11)

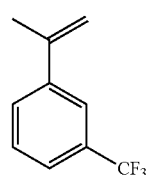

(b-12)

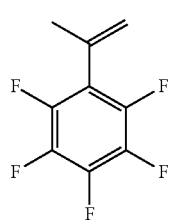

Note that the monomer unit (B) is preferably a structural unit derived from α-methylstyrene or 4-fluoro-α-methylstyrene from a viewpoint of ease of production of the copolymer and improving main chain scission properties upon irradiation with ionizing radiation or the like and heat resistance, and is more preferably a structural unit derived from 4-fluoro-α-methylstyrene from a viewpoint of further improving heat resistance of the copolymer and resolution and clarity of an obtained resist pattern. In other words, the copolymer preferably includes an α-methylstyrene unit or a 4-fluoro-α-methylstyrene unit, and more preferably includes a 4-fluoro-α-methylstyrene unit.

<Properties of Copolymer>

The copolymer is required to have a molecular weight distribution of 1.7 or less. The molecular weight distribution of the copolymer is preferably 1.2 or more, and is preferably 1.5 or less. When the molecular weight distribution is not more than any of the upper limits set forth above, the resolution and clarity of a resist pattern formed using the copolymer can be sufficiently improved. Moreover, when the molecular weight distribution is not less than the lower limit set forth above, the copolymer is easier to produce.

The weight-average molecular weight of the copolymer is preferably 10,000 or more, more preferably 30,000 or more, and even more preferably 40,000 or more, and is preferably 80,000 or less, more preferably 70,000 or less, and even more preferably 60,000 or less. When the weight-average molecular weight is not more than any of the upper limits set forth above, sensitivity to ionizing radiation or the like can be improved. Moreover, when the weight-average molecular weight is not less than any of the lower limits set forth above, the resolution and clarity of a resist pattern formed using the copolymer can be sufficiently improved.

The number-average molecular weight of the copolymer is preferably 6,000 or more, and more preferably 24,000 or more, and is preferably 66,000 or less, and more preferably 49,000 or less. When the number-average molecular weight is within any of the ranges set forth above, sensitivity to ionizing radiation or the like can be suitably improved.

(Production Method of Copolymer)

The copolymer including the monomer unit (A) and the monomer unit (B) set forth above can be produced, for example, by carrying out polymerization of a monomer composition that contains the monomer (a) and the monomer (b), and then collecting and optionally purifying an obtained copolymer.

The chemical composition, molecular weight distribution, weight-average molecular weight, and number-average molecular weight of the copolymer can be adjusted by altering the polymerization conditions and the purification conditions. In one specific example, the weight-average molecular weight and the number-average molecular weight can be reduced by raising the polymerization temperature. In another specific example, the weight-average molecular weight and the number-average molecular weight can be reduced by shortening the polymerization time. Moreover, the molecular weight distribution can be reduced by performing purification.

<Polymerization of Monomer Composition>

The monomer composition used in production of the presently disclosed copolymer may be a mixture containing a monomer component that includes the monomer (a) and the monomer (b), an optional solvent, a polymerization initiator, and optionally added additives. Polymerization of the monomer composition may be carried out by a known method. In particular, the use of cyclopentanone or the like as the solvent is preferable, and the use of a radical polymerization initiator such as azobisisobutyronitrile as the polymerization initiator is preferable.

A polymerized product obtained through polymerization of the monomer composition may, without any specific limitations, be collected by adding a good solvent such as tetrahydrofuran to a solution containing the polymerized product and subsequently dripping the solution to which the good solvent has been added into a poor solvent such as methanol to coagulate the polymerized product.

<Purification of Polymerized Product>

The method of purification in a case in which the obtained polymerized product is purified may be, but is not specifically limited to, a known purification method such as reprecipitation or column chromatography. Of these purification methods, purification by reprecipitation is preferable.

Note that purification of the polymerized product may be performed repeatedly.

Purification of the polymerized product by reprecipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to cause precipitation of a portion of the polymerized product. When purification of the polymerized product is carried out by dripping a solution of the polymerized product into a mixed solvent of a good solvent and a poor solvent as described above, the molecular weight distribution, weight-average molecular weight, and number-average molecular weight of the resultant copolymer can easily be adjusted by altering the types and/or mixing ratio of the good solvent and the poor solvent. In one specific example, the molecular weight of copolymer that precipitates in the mixed solvent can be increased by increasing the proportion of the good solvent in the mixed solvent.

Also note that in a situation in which the polymerized product is purified by reprecipitation, polymerized product that precipitates in the mixed solvent of the good solvent and the poor solvent may be used as the presently disclosed copolymer, or polymerized product that does not precipitate in the mixed solvent (i.e., polymerized product dissolved in the mixed solvent) may be used as the presently disclosed copolymer, so long as the polymerized product that is used satisfies the desired properties. Polymerized product that does not precipitate in the mixed solvent can be collected from the mixed solvent by a known technique such as concentration to dryness.

(Positive Resist Composition)

The presently disclosed positive resist composition contains the copolymer set forth above and a solvent, and may optionally further contain known additives that can be included in resist compositions. As a result of containing the copolymer set forth above as a positive resist, the presently disclosed positive resist composition can be suitably used to form a resist film having excellent heat resistance and can form a resist pattern having excellent resolution and clarity when used in resist pattern formation.

<Solvent>

The solvent may be any solvent in which the copolymer set forth above is soluble without any specific limitations. For example, known solvents such as those described in JP5938536B can be used. Of such solvents, anisole, propylene glycol monomethyl ether acetate (PGMEA), cyclopentanone, cyclohexanone, or isoamyl acetate is preferably used as the solvent from a viewpoint of obtaining a positive resist composition having a suitable viscosity and improving coatability of the positive resist composition.

EXAMPLES

The following provides a more specific description of the present disclosure based on examples. However, the present disclosure is not limited to the following examples.

In the examples and comparative examples, the following methods were used to evaluate the weight-average molecular weight, number-average molecular weight, molecular weight distribution, heat resistance, glass-transition temperature, sensitivity, and γ value of an obtained copolymer, and the resolution of a resist pattern.

<Weight-Average Molecular Weight, Number-Average Molecular Weight, and Molecular Weight Distribution>

The weight-average molecular weight (Mw) and the number-average molecular weight (Mn) of an obtained copolymer were measured by gel permeation chromatography, and the molecular weight distribution (Mw/Mn) of the copolymer was calculated.

Specifically, the weight-average molecular weight (Mw) and the number-average molecular weight (Mn) of the copolymer were determined as standard polystyrene-equivalent values using a gel permeation chromatograph (HLC-8220 produced by Tosoh Corporation), with tetrahydrofuran as an eluent solvent. The molecular weight distribution (Mw/Mn) was then calculated.

<Heat Resistance>

The 0.5% weight loss temperature and the 1.0% weight loss temperature were measured for an obtained copolymer in a stream of nitrogen under a heating condition of 10° C./min using a simultaneous thermogravimetric analyzer (STA7000 produced by Hitachi High-Tech Science Corporation). A higher 0.5% weight loss temperature and a higher 1.0% weight loss temperature indicate better heat resistance.

<Glass-Transition Temperature>

The glass-transition temperature of an obtained copolymer was measured in a stream of nitrogen under a heating condition of 10° C./min using a simultaneous thermogravimetric analyzer (STA7000 produced by Hitachi High-Tech Science Corporation).

<Sensitivity and γ Value>

A spin coater (MS-A150 produced by Mikasa Co., Ltd.) was used to apply a positive resist composition of 11 mass % in concentration onto a silicon wafer of 4 inches in diameter such as to have a thickness of 500 nm. The applied positive resist composition was heated for 5 minutes by a hot plate having a temperature of 160° C. to form a resist film on the silicon wafer. An electron beam lithography tool (ELS-S50 produced by Elionix Inc.) was used to write a plurality of patterns (dimensions: 500 μm×500 μm) over the resist film with different electron beam irradiation doses, and development treatment was carried out for 1 minute at a temperature of 23° C. using a fluorine-containing solvent (produced by Du Pont-Mitsui Fluorochemicals Co., Ltd.; Vertrel XF® (Vertrel XF is a registered trademark in Japan, other countries, or both); $CF_3CFHCFHCF_2CF_3$) as a resist developer. Thereafter, 10 seconds of rinsing was performed using a fluorine-containing solvent (produced by 3M; Novec® 7100 (Novec is a registered trademark in Japan, other countries, or both); methyl nonafluorobutyl ether) as a rinsing liquid. Note that the electron beam irradiation dose was varied in a range of 4 μC/cm$^2$ to 200 μC/cm$^2$ in increments of 4 μC/cm$^2$. Next, an optical film thickness measurement tool (Lambda Ace produced by SCREEN Semiconductor Solutions Co., Ltd.) was used to measure the thickness of the resist film in regions in which writing had been performed. A sensitivity curve was prepared that indicated a relationship between the common logarithm of the total electron beam irradiation dose and the remaining film fraction of the resist film after development (=thickness of resist film after development/thickness of resist film formed on silicon wafer).

The obtained sensitivity curve (horizontal axis: common logarithm of total electron beam irradiation dose; vertical axis: remaining film fraction of resist film (0≤remaining film fraction≤1.00)) was fitted to a quadratic function in a range from a remaining film fraction of 0.20 to a remaining film fraction of 0.80, and a straight line that joined points on the obtained quadratic function (function of remaining film fraction and common logarithm of total irradiation dose) corresponding to remaining film fractions of 0 and 0.50 (linear approximation for gradient of sensitivity curve) was prepared. Thereafter, the total electron beam irradiation dose $E_{th}$ (μC/cm$^2$) was determined for when the remaining film fraction on the obtained straight line (function of remaining film fraction and common logarithm of total irradiation dose) was 0. A smaller value for $E_{th}$ indicates higher sensitivity and that scission of the copolymer serving as a positive resist can occur well at a smaller irradiation dose.

In addition, the γ value was determined by the formula shown below. In the following formula, $E_0$ is the logarithm of the total irradiation dose obtained when the sensitivity curve is fitted to a quadratic function in a range from a remaining film fraction of 0.20 to a remaining film fraction of 0.80, and then a remaining film fraction of 0 is substituted with respect to the obtained quadratic function (function of remaining film fraction and common logarithm of total irradiation dose). Also, $E_1$ is the logarithm of the total irradiation dose obtained when a straight line is prepared that joins points on the obtained quadratic function corresponding to remaining film fractions of 0 and 0.50 (linear approximation for gradient of sensitivity curve), and then a remaining film fraction of 1.00 is substituted with respect to the obtained straight line (function of remaining film fraction and common logarithm of total irradiation dose). The following formula expresses the gradient of the straight line between a remaining film fraction of 0 and a remaining film fraction of 1.00. A larger γ value indicates that the sensitivity curve has a larger gradient and that a clear pattern can be better formed.

$$\gamma = \left| \log_{10}\left(\frac{E_1}{E_0}\right) \right|^{-1}$$

<Resolution of Resist Pattern>

A spin coater (MS-A150 produced by Mikasa Co., Ltd.) was used to apply a positive resist composition of 2 mass % in concentration onto a silicon wafer of 4 inches in diameter. Next, the applied positive resist composition was heated for 5 minutes by a hot plate having a temperature of 160° C. to form a resist film of 50 nm in thickness on the silicon wafer. An electron beam lithography tool (ELS-S50 produced by Elionix Inc.) was used to expose the resist film to an optimal exposure dose ($E_{op}$) and thereby write a pattern. Thereafter, development treatment was carried out for 1 minute at a temperature of 23° C. using a fluorine-containing solvent (produced by Du Pont-Mitsui Fluorochemicals Co., Ltd.; Vertrel XF®; $CF_3CFHCFHCF_2CF_3$) as a resist developer. Next, 10 seconds of rinsing was performed using a fluorine-containing solvent (produced by 3M; Novec® 7100; methyl nonafluorobutyl ether) as a rinsing liquid to form a resist pattern. Note that the optimal exposure dose ($E_{op}$) was set as appropriate with a value approximately double $E_{th}$ measured as described above as a rough guide. Also note that lines (non-exposed regions) and spaces (exposed regions) of the resist pattern were set as 18 nm and 20 nm (i.e., half pitches of 18 nm and 20 nm).

A scanning electron microscope (SEM) was used to observe the pattern at ×100,000 magnification, and the half pitch at which a pattern was formed was taken to be the resolution.

Example 1

<Production of Copolymer>
[Synthesis of Polymerized Product]

A glass ampoule in which a stirrer had been placed was charged with 3.00 g of 1-phenyl-1-trifluoromethyl-2,2,2-trifluoroethyl α-chloroacrylate as a monomer (a), 2.493 g of α-methylstyrene as a monomer (b), and 0.0039534 g of azobisisobutyronitrile as a polymerization initiator and was tightly sealed. Oxygen was removed from the system through 10 repetitions of pressurization and depressurization with nitrogen gas.

The system was then heated to 78° C. and a reaction was carried out for 3.5 hours. Next, 10 g of tetrahydrofuran was added to the system and then the resultant solution was dripped into 300 mL of methanol to cause precipitation of a polymerized product. Thereafter, the polymerized product that had precipitated was collected by filtration.
[Purification of Polymerized Product]

Next, the obtained polymerized product was dissolved in 100 g of tetrahydrofuran (THF), and the resultant solution was dripped into a mixed solvent of 150 g of THF and 850 g of methanol (MeOH) to cause precipitation of a white coagulated material (copolymer comprising α-methylstyrene units and 1-phenyl-1-trifluoromethyl-2,2,2-trifluoroethyl α-chloroacrylate units). Thereafter, the solution containing the copolymer that had precipitated was filtered using a Kiriyama funnel to obtain a white copolymer. The weight-average molecular weight, number-average molecular weight, molecular weight distribution, heat resistance, and glass-transition temperature of the obtained copolymer were measured. The results are shown in Table 1.

Note that the obtained copolymer comprised 50 mol % each of α-methylstyrene units and 1-phenyl-1-trifluoromethyl-2,2,2-trifluoroethyl α-chloroacrylate units.
<Production of Positive Resist Compositions>

Resist solutions (positive resist compositions) having copolymer concentrations of 11 mass % and 2 mass % were produced by dissolving the obtained copolymer in isoamyl acetate as a solvent.

A positive resist composition formed of the resist solution in which the copolymer concentration was 11 mass % was used to evaluate the sensitivity and γ value of the copolymer. Moreover, a positive resist composition formed of the resist solution in which the copolymer concentration was 2 mass % was used to evaluate the resolution of a resist pattern. The results are shown in Table 1.

Example 2

A copolymer and positive resist compositions were produced in the same way as in Example 1 with the exception that the mixed solvent used in purification of the polymerized product was changed to a mixed solvent of 200 g of THF and 800 g of MeOH. Evaluations were conducted in the same manner as in Example 1. The results are shown in Table 1.

Example 3

A copolymer and positive resist compositions were produced in the same way as in Example 1 with the exception that the mixed solvent used in purification of the polymerized product was changed to a mixed solvent of 250 g of THF and 750 g of MeOH. Evaluations were conducted in the same manner as in Example 1. The results are shown in Table 1.

Example 4

A copolymer and positive resist compositions were produced in the same way as in Example 1 with the exception that the mixed solvent used in purification of the polymerized product was changed to a mixed solvent of 300 g of THF and 700 g of MeOH. Evaluations were conducted in the same manner as in Example 1. The results are shown in Table 1.

Comparative Example 1

A copolymer (polymerized product) and positive resist compositions were produced in the same way as in Example 1 with the exception that purification of the polymerized product was not performed, and the polymerized product collected by filtration was used in production of the positive resist compositions. Evaluations were conducted in the same manner as in Example 1. The results are shown in Table 1.

Comparative Example 2

A copolymer and positive resist compositions were produced in the same way as in Example 1 with the exception that the mixed solvent used in purification of the polymerized product was changed to a mixed solvent of 100 g of THF and 900 g of MeOH. Evaluations were conducted in the same manner as in Example 1. The results are shown in Table 1.

Comparative Example 3

A copolymer and positive resist compositions were produced in the same way as in Example 1 with the exception that the mixed solvent used in purification of the polymerized product was changed to a mixed solvent of 350 g of THF and 650 g of MeOH. Evaluations were conducted in the same manner as in Example 1. The results are shown in Table 1.

A positive resist composition formed of the resist solution in which the copolymer concentration was 11 mass % was used to evaluate the sensitivity and γ value of the copolymer. Moreover, a positive resist composition formed of the resist solution in which the copolymer concentration was 2 mass % was used to evaluate the resolution of a resist pattern. The results are shown in Table 2.

Example 6

In production of a copolymer, a polymerized product obtained by filtration was dissolved in 100 g of THF, and the resultant solution was dripped into a mixed solvent of 50 g of THF and 950 g of MeOH to cause precipitation of a white coagulated material (copolymer comprising 4-fluoro-α-methylstyrene units and 1-phenyl-1-trifluoromethyl-2,2,2-trifluoroethyl α-chloroacrylate units). Thereafter, the solution containing the copolymer that had precipitated was filtered using a Kiriyama funnel to obtain a white copolymer.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| Copolymer | Number-average molecular weight (Mn) [−] | 39845 | 45630 | 47563 | 48574 | 31799 | 33943 | 49854 |
|  | Weight-average molecular weight (Mw) [−] | 62344 | 66729 | 69843 | 76854 | 58166 | 59232 | 85123 |
|  | Molecular weight distribution (Mw/Mn) [−] | 1.565 | 1.462 | 1.468 | 1.582 | 1.829 | 1.745 | 1.707 |
| Evaluation | $E_{th}$ [μC/cm$^2$] | 293.365 | 300.836 | 309.712 | 313.832 | 278.125 | 283.475 | 328.23 |
|  | γ value [−] | 18.543 | 19.423 | 20.121 | 19.234 | 17.222 | 17.944 | 18.231 |
|  | Resolution [nm] | 18 | 18 | 18 | 18 | 20 | 18 | 20 |
|  | 0.5% weight loss temperature [° C.] | 220.3 | 221.41 | 221.45 | 220.86 | 154.76 | 219.21 | 218.23 |
|  | 1.0% weight loss temperature [° C.] | 222.1 | 222.9 | 223.4 | 221.5 | 184.41 | 220.1 | 220.1 |
|  | Glass-transition temperature [° C.] | 158.4 | 159.2 | 159.3 | 159.6 | 157.4 | 157.9 | 158.3 |

Example 5

<Production of Copolymer>

A glass ampoule in which a stirrer had been placed was charged with 3.00 g of 1-phenyl-1-trifluoromethyl-2,2,2-trifluoroethyl α-chloroacrylate as a monomer (a), 2.873 g of 4-fluoro-α-methylstyrene as a monomer (b), and 0.0039534 g of azobisisobutyronitrile as a polymerization initiator and was tightly sealed. Oxygen was removed from the system through 10 repetitions of pressurization and depressurization with nitrogen gas.

The system was then heated to 78° C. and a reaction was carried out for 3.5 hours. Next, 10 g of tetrahydrofuran was added to the system and then the resultant solution was dripped into 300 mL of methanol to cause precipitation of a polymerized product. Thereafter, the polymerized product that had precipitated was collected by filtration to obtain a copolymer. The weight-average molecular weight, number-average molecular weight, molecular weight distribution, heat resistance, and glass-transition temperature of the obtained copolymer were measured. The results are shown in Table 2.

Note that the obtained copolymer comprised 50 mol % each of 4-fluoro-α-methylstyrene units and 1-phenyl-1-trifluoromethyl-2,2,2-trifluoroethyl α-chloroacrylate units.

<Production of Positive Resist Compositions>

Resist solutions (positive resist compositions) having copolymer concentrations of 11 mass % and 2 mass % were produced by dissolving the obtained copolymer in isoamyl acetate as a solvent.

With the exception of the above, positive resist compositions were produced in the same way as in Example 5. Evaluations were conducted in the same manner as in Example 5. The results are shown in Table 2.

Example 7

A copolymer and positive resist compositions were produced in the same way as in Example 6 with the exception that the used mixed solvent was changed to a mixed solvent of 100 g of THF and 900 g of MeOH. Evaluations were conducted in the same manner as in Example 5. The results are shown in Table 2.

Example 8

A copolymer and positive resist compositions were produced in the same way as in Example 6 with the exception that the used mixed solvent was changed to a mixed solvent of 150 g of THF and 850 g of MeOH. Evaluations were conducted in the same manner as in Example 5. The results are shown in Table 2.

Example 9

A copolymer and positive resist compositions were produced in the same way as in Example 6 with the exception that the used mixed solvent was changed to a mixed solvent of 200 g of THF and 800 g of MeOH. Evaluations were conducted in the same manner as in Example 5. The results are shown in Table 2.

Comparative Example 4

A copolymer and positive resist compositions were produced in the same way as in Example 6 with the exception that the used mixed solvent was changed to a mixed solvent of 250 g of THF and 750 g of MeOH. Evaluations were conducted in the same manner as in Example 5. The results are shown in Table 2.

TABLE 2

| | | Example 5 | Example 6 | Example 7 | Example 8 | Example 9 | Comparative Example 4 |
|---|---|---|---|---|---|---|---|
| Copolymer | Number-average molecular weight (Mn) [-] | 25391 | 30293 | 36226 | 38472 | 47563 | 50321 |
| | Weight-average molecular weight (Mw) [-] | 42252 | 45632 | 53472 | 55648 | 73495 | 87684 |
| | Molecular weight distribution (Mw/Mn) [-] | 1.664 | 1.506 | 1.476 | 1.446 | 1.545 | 1.742 |
| Evaluation | $E_{th}$ [µC/cm$^2$] | 178.345 | 188.653 | 197.377 | 203.422 | 208.341 | 211.119 |
| | γ value [-] | 19.345 | 21.234 | 23.697 | 23.795 | 21.388 | 18.232 |
| | Resolution [nm] | 18 | 18 | 18 | 18 | 18 | 20 |
| | 0.5% weight loss temperature [° C.] | 227.86 | 222.92 | 223.21 | 223.32 | 223.36 | 221.23 |
| | 1.0% weight loss temperature [° C.] | 232.18 | 232.1 | 224.28 | 225.21 | 226.21 | 226.23 |
| | Glass-transition temperature [° C.] | 154.6 | 155.3 | 157.1 | 157.8 | 157.9 | 156.8 |

It can be seen from Table 1 that the copolymers of Examples 1 to 4 had excellent heat resistance and could form a resist pattern having excellent resolution and clarity compared to the copolymers of Comparative Examples 1 to 3, which had large molecular weight distributions.

Moreover, it can be seen from Table 2 that the copolymers of Examples 5 to 9 had excellent heat resistance and could form a resist pattern having excellent resolution and clarity compared to the copolymer of Comparative Example 4, which had a large molecular weight distribution.

INDUSTRIAL APPLICABILITY

Through the presently disclosed copolymer, it is possible to provide a main chain scission-type positive resist that has excellent heat resistance and that can form a resist pattern having excellent resolution and clarity.

Moreover, through the presently disclosed positive resist composition, it is possible to form a resist film that has excellent heat resistance and a resist pattern that has excellent resolution and clarity.

The invention claimed is:

1. A copolymer comprising:
a monomer unit (A) represented by formula (I), shown below,

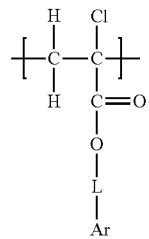

where, in formula (I), L is an optionally substituted alkylene group and Ar is an optionally substituted aromatic ring group; and a monomer unit (B) represented by formula (II), shown below,

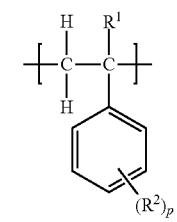

where, in formula (II), R$^1$ is an alkyl group, R$^2$ is an alkyl group, a halogen atom, or a haloalkyl group, p is an integer of not less than 0 and not more than 5, and in a case in which more than one R$^2$ is present, each R$^2$ may be the same or different, wherein
the copolymer has a molecular weight distribution of 1.7 or less.

2. The copolymer according to claim 1, having a weight-average molecular weight of 80,000 or less.

3. A positive resist composition comprising: the copolymer according to claim 1; and a solvent.

4. A copolymer comprising:
a monomer unit (A) represented by formula (I), shown below,

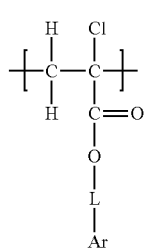
(I)

where, in formula (I), L is a divalent linking group that includes an electron withdrawing group and Ar is an optionally substituted aromatic ring group; and
a monomer unit (B) represented by formula (II), shown below,

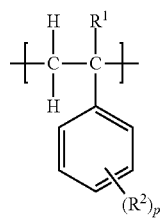
(II)

where, in formula (II), $R^1$ is an alkyl group, $R^2$ is an alkyl group, a halogen atom, or a haloalkyl group, p is an integer of not less than 0 and not more than 5, and in a case in which more than one $R^2$ is present, each $R^2$ may be the same or different, wherein the copolymer has a molecular weight distribution of 1.7 or less.

5. The copolymer according to claim 4, wherein the electron withdrawing group is at least one selected from the group consisting of a fluorine atom, a fluoroalkyl group, a cyano group, and a nitro group.

6. The copolymer according to claim 4, having a weight-average molecular weight of 80,000 or less.

7. A positive resist composition comprising: the copolymer according to claim 4; and a solvent.

8. A copolymer comprising:
a monomer unit (A) and a monomer unit (B),
the monomer unit (A) is a 1-phenyl-1-trifluoromethyl-2,2,2-trifluoroethyl α-chloroacrylate unit or a benzyl α-chloroacrylate unit, and
the monomer unit (B) is an α-methylstyrene unit or a 4-fluoro-α-methylstyrene unit wherein the copolymer has a molecular weight distribution of 1.7 or less.

9. The copolymer according to claim 8, having a weight-average molecular weight of 80,000 or less.

10. A positive resist composition comprising: the copolymer according to claim 8; and a solvent.

* * * * *